United States Patent
Wang

[11] Patent Number: 6,093,228
[45] Date of Patent: Jul. 25, 2000

[54] METHOD AND DEVICE FOR COLLECTING BY-PRODUCTS INDIVIDUALLY

[75] Inventor: Chung-Chih Wang, Hsinchu, Taiwan

[73] Assignee: Winbond Electronics Corp., Taiwan

[21] Appl. No.: 09/195,582

[22] Filed: Nov. 18, 1998

[51] Int. Cl.[7] .............................. B01D 33/15; B01D 46/12
[52] U.S. Cl. .............................. 55/385.1; 55/323; 55/329; 55/392; 55/429; 96/400; 96/421
[58] Field of Search .......................... 55/323, 329, 385.1, 55/385.2, 357, 392, 413, 429; 96/253, 400, 421

[56] References Cited

U.S. PATENT DOCUMENTS

| | | | |
|---|---|---|---|
| 1,689,104 | 10/1928 | Bennett | 55/429 |
| 2,468,354 | 4/1949 | Abbrecht | 55/329 |
| 2,768,707 | 10/1956 | Campbell | 55/429 |
| 3,126,263 | 3/1964 | Schwab | 55/329 |
| 3,174,264 | 3/1965 | McKnab | 55/429 |
| 3,435,597 | 4/1969 | Levy | 55/329 |
| 4,853,010 | 8/1989 | Spence et al. | 55/392 |
| 4,881,952 | 11/1989 | Masaru | 55/429 |
| 5,049,170 | 9/1991 | Parnoff | 55/323 |
| 5,536,298 | 7/1996 | Awaji | 55/329 |
| 5,814,115 | 9/1998 | Allen et al. | 55/357 |
| 5,840,091 | 11/1998 | Strong | 55/385.1 |
| 5,846,274 | 12/1998 | Smelser | 55/385.2 |
| 5,862,737 | 1/1999 | Chiu et al. | 96/421 |
| 5,879,545 | 3/1999 | Antoun | 96/421 |

*Primary Examiner*—David A. Simmons
*Assistant Examiner*—Minh-Chau T. Pham
*Attorney, Agent, or Firm*—Laff, Whitesel & Saret, Ltd.; J. Warren Whitesel

[57] ABSTRACT

A method and a device for collecting by-products individually, applied to the semiconductor manufacture factory, is disclosed. The device, adapted to be used to filter a fluid accompanied with an object, for retaining the object therein includes a body, an entrance provided on an upper portion of the body for enabling the fluid to flow into the body, a powder trap mounted in the body for filtering the fluid to retain the object therein, a guiding device mounted in the body for guiding the fluid to pass the powder trap, and an exit provided on a lower portion of the body for enabling the filtered fluid to flow out. The advantages of the present invention have: (a) preventing the by-products from being reacted with each other resulting in a fire; (b) preventing the low vacuum tube from being chocked by by-products; and (c) collecting the by-products individually.

20 Claims, 6 Drawing Sheets

METHOD AND DEVICE FOR COLLECTING BY-PRODUCTS INDIVIDUALLY

FIELD OF THE INVENTION

The present invention is related to a method and a device for collecting by-products individually, and more particularly to a method and a device for collecting by-products individually to be applied in a semiconductor manufacturing factory.

BACKGROUND OF THE INVENTION

Many types of machines has been set up in a semiconductor manufacturing factory and a liquid crystal display manufacturing factory. Several by-products will be formed in the semiconductor manufacturing process. When finishing the semiconductor manufacturing process, those by-products are remained in the machines so that the user needs to clean the by-products out of the machines periodically. Those by-products may be in forms of powder, crushed piece, and chunk. The user needs to maintain the machines for avoiding a particle defect of the products. The maintaining task is to draw the unuseful powder by a low vacuum system to keep the machines in a normal state. However, there are usually different by-products generated in different machines. For an example, a first machine is provided for depositing silicide and a second machine is provided for etching silicon nitride. When the first machine and the second machine are operated in a series of semiconductor manufacturing process, there are two different types of by-products α and β remained in the first machine and the second machine respectively.

Please refer to FIGS. 1 to 3. When maintaining the machines A, B, C, D as shown in FIG. 3 (in fact, the total number of the machines in a manufacturing factory is above two hundred), the user needs to draw the by-products such as the powder individually by a low vacuum system 32. The user must plug the inlet 201 of the first low vacuum tube 20 in the socket 202 for drawing the by-products from the machines A, B, C, D through the socket 202 and the low vacuum tube 20. As shown in FIG. 2, the socket 202 has many sub-tubes 203 and two steel rods 204 secured cross to each other, and the by-product in machine A will be carried by the airflow generated from the low vacuum system 32 to flow through the second low vacuum tube 30 directly. At the present time, the low vacuum system 32 in a general manufacturing factory does not have a collecting device mounted in the socket 202 for filtering the airflow accompanied with the by-products so that there are always some by-products accumulated inside the low vacuum tube 30 during pumping.

Taking an example as shown in FIG. 2, there are four different kinds of by-products accumulated inside the surface of the second low vacuum tube 30 continuously, more especially in the connection 31 during pumping. Those by-products will react with each other to form new by-products or generate static electricity resulting in a fire originating from the connection 31. Those by-products can also reduce the useful life of the low vacuum system 32 and increase the maintaining cost of the factory.

In addition, it still has danger due to the improper treatment of the by-products. Every kind of by-product is accumulated continuously in the same spot so that they will react with each other to generate a poison gas. If someone inhales the poison gas, it will influence the health of the people. It is desired to develop a method to solve the problems encountered with the prior art.

SUMMARY OF THE INVENTION

An object of the present invention is to provide a device, adapted to be used to filter a fluid accompanied with an object, for retaining the object therein. The device includes a body, an entrance provided on an upper portion of the body for enabling the fluid to flow into the body, a powder trap mounted in the body for filtering the fluid to retain the object therein, a guiding device mounted in the body for guiding the fluid to pass the powder trap, and an exit provided on a lower portion of the body for enabling the filtered fluid to flow out. The collecting device of the present invention is used to collect by-products generated in a semiconductor manufacturing process. By using the collecting device, the user can collect by-products individually from machines in order to prevent the by-products from being reacted with each other resulting in a fire, and prevent the low vacuum tube from being chocked by by-products.

The exit of the collecting device is connected to a vacuum system for forming a suction head to drive the fluid. The collecting device further includes a handle for moving the device easily. There is a pressure gauge mounted on the collecting device for measuring a pressure inside the device to determine the time for changing the powder trap. The pressure gauge has a probe mounted between the powder trap and the exit for measuring the pressure near the exit.

The collecting device of the present invention further includes a holding element for holding the powder trap. The holding element includes a screw mounted through a tap hole of the powder trap to secure one end of the powder trap. The collecting device further includes a pressing element, and the holding element further includes a piece of rubber mounted between the pressing element and the screw for securing the powder trap. The collecting device further includes an openable upper cover which is removed while changing the powder trap and cleaning the body of the device. The openable upper cover has an exit cover and a pin for closely securing the exit cover to the openable upper cover. The device further includes a hooking ring for hooking the openable upper cover. The body of the collecting device is a cylinder which is 35 cm in height and 25 cm in diameter. The guiding device has a smoothly curved surface with an upper cross section bigger than a lower cross section of the guiding device. There is a cavity formed between the powder trap and walls of the body for enabling the fluid to flow through bottom and side surfaces of the powder trap. The collecting device further includes a supporting device having an opening for placing the device thereon. The supporting device has a base plate for receiving the object fallen from the exit of the device.

Another object of the present invention is to provide a device, adapted to be used to filter a fluid accompanied therewith an object, for retaining the object therein. The device includes a body, an entrance provided on an upper portion of the body for enabling the fluid to flow into the body, a powder trap mounted in the body for filter the fluid to retain the object therein wherein there is a cavity formed between the powder trap and walls of the body for enabling the fluid to flow through bottom and side surfaces of the powder trap, and an exit provided on a lower portion of the body for enabling the filtered fluid to flow out.

The present invention also provides a method for collecting a first by-product from a first apparatus and a second by-product from a second apparatus individually. The method includes the steps of providing a first collecting device for collecting the first by-product from the first apparatus, and providing a second collecting device for collecting the second by-product from the second apparatus to prevent the first by-product from being mixed with the second by-product. The apparatus of the present invention is a machine applied for a semiconductor manufacturing process. The method further includes a step of providing a vacuum system connected to the first collecting device and the second collecting device for forming airflow to carry said by-products.

In accordance with the above-description, the method and device for collecting by-products individually have the advantages of preventing the by-products from being reacted with each other, resulting in a fire. It can also prevent the low vacuum tube from being chocked with the by-products. It is very convenient to set up the collecting device by plugging it in the inlet of the low vacuum system. It is also very easy to assemble or disassemble the collecting device for changing the powder trap and does not occupy much space for maintaining the machine.

The present invention may best be understood through the following description with reference to the accompanying drawings, in which:

DETAILED DESCRIPTION OF THE PREFERRED EMBODIMENTS

Figure 1:
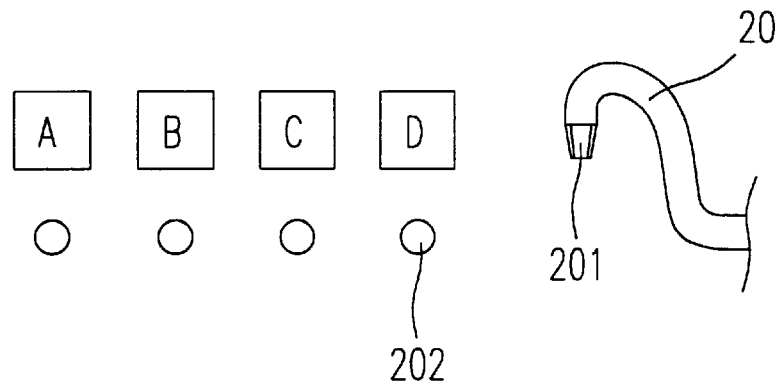
FIG. 1 is a schematic diagram showing a general socket of the low vacuum tube.
Figure 2:
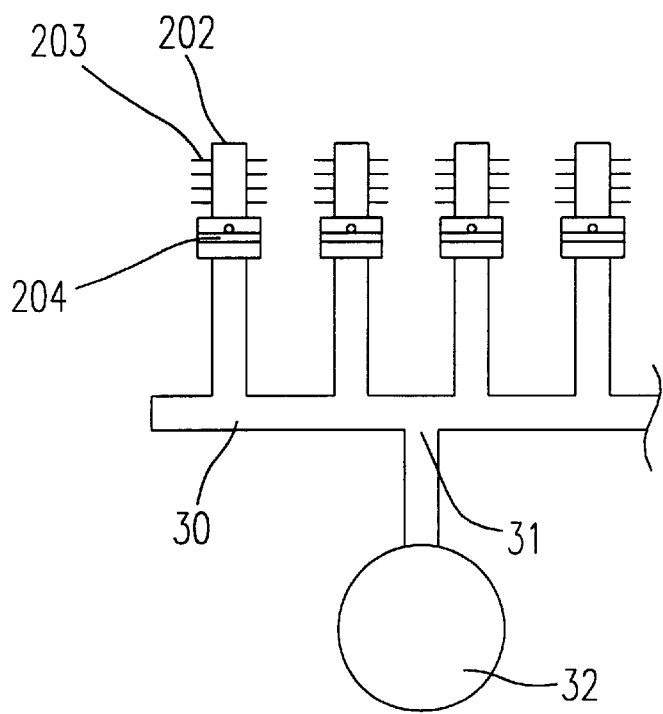
FIG. 2 is a cross-sectional view showing the four sockets of the FIG. 1.
Figure 3:
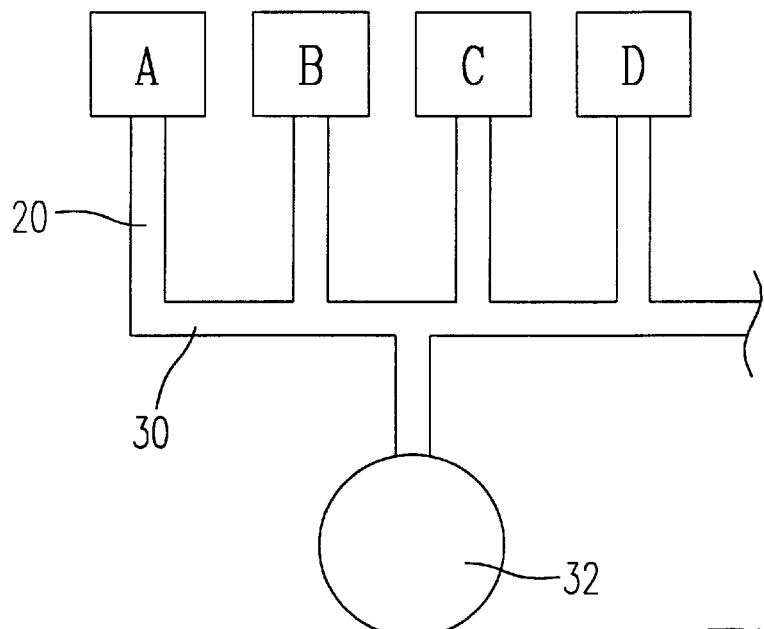
FIG. 3 is a schematic diagram showing a low vacuum system connected to the machine in use.
Figure 4:
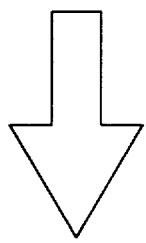
FIG. 4 is a schematic diagram showing a preferred embodiment of the present invention in use.
Figure 4:
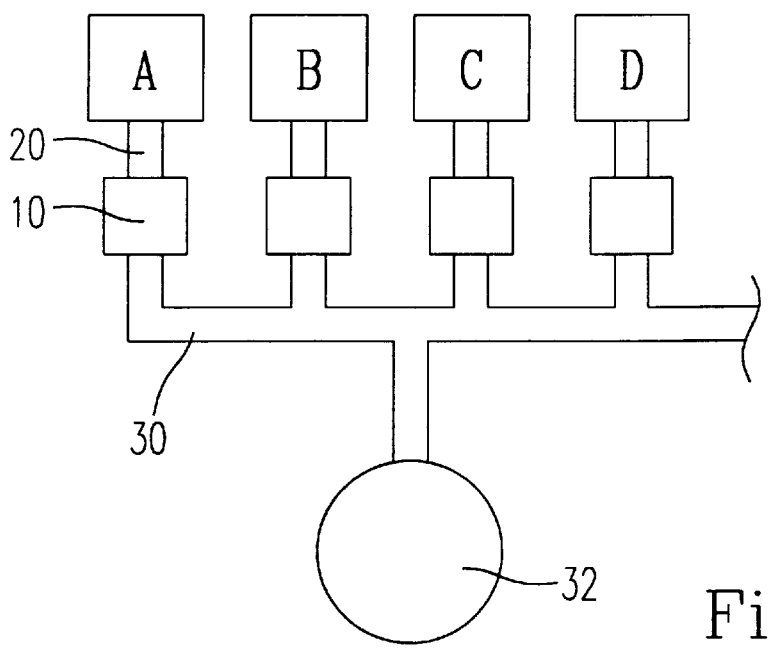

The method for collecting by-products individually is mainly provided for collecting unuseful powder generated in a semiconductor manufacturing process from machines. Please refer to FIG. 4. The method for collecting a first by-product α from a first machine A and a second by-product β from a second machine B individually includes the steps of providing a first collecting device 10 for collecting the first by-product α from the first machine A, and providing a second collecting device for collecting the second by-product β from the second machine B to prevent the first by-product α from being reacted with the second by-product β, resulting in a fire. A low vacuum system 32 is connected to the first collecting device 10 and the second collecting device 10 for forming airflow to carry the by-products. The first collecting device 10 can be used in the same type of the first machine A and the second collecting device 10 can be used in the same type of the second machine B to reduce the required number of the collecting device 10. The third machine C which is different from the first machine A and the second machine B can use a third collecting device 10 for collecting the third by-product γ.

Figure 5:
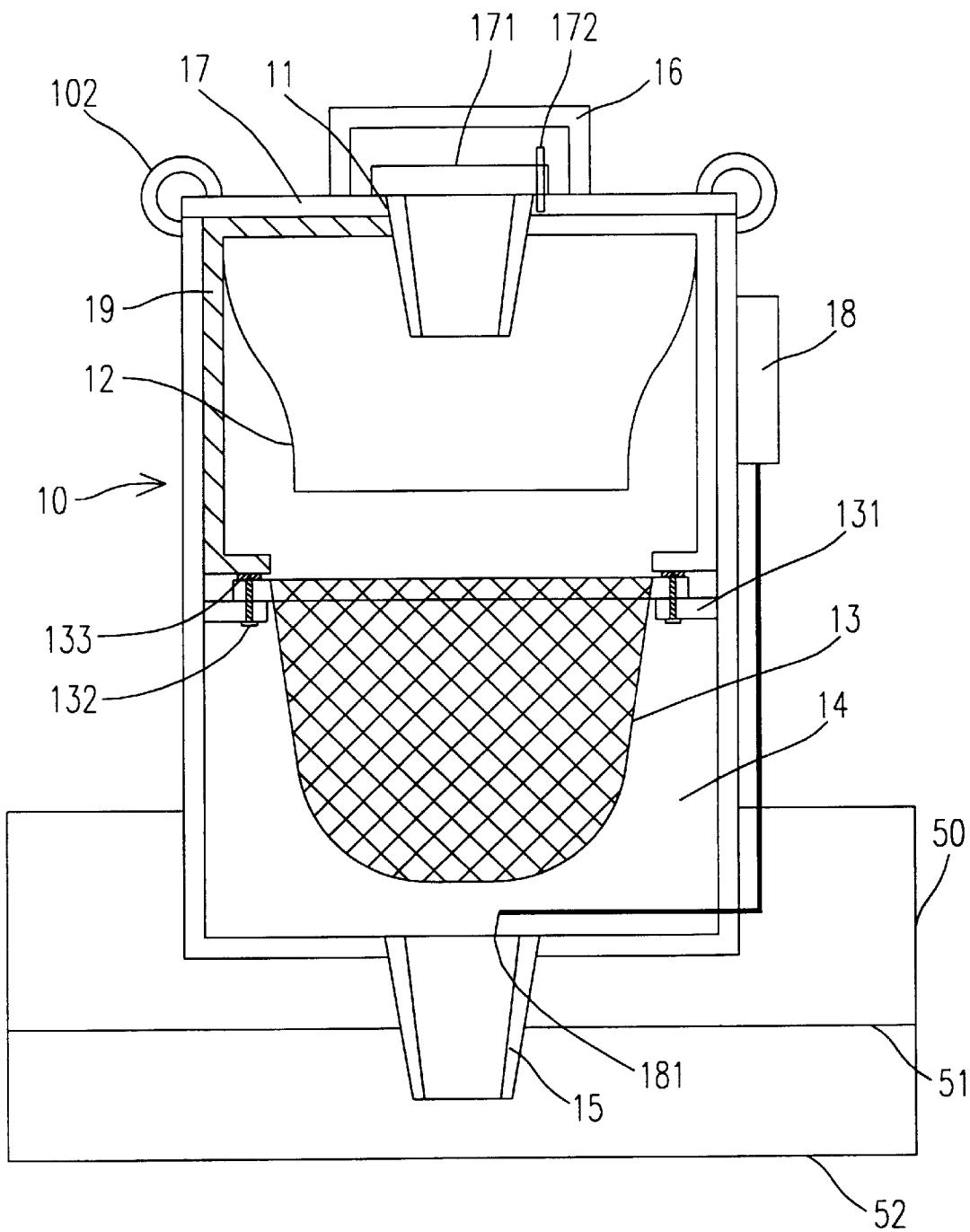
FIG. 5 is a schematic diagram showing a preferred embodiment of a device for collecting by-products according to the present invention.
Figure 6:
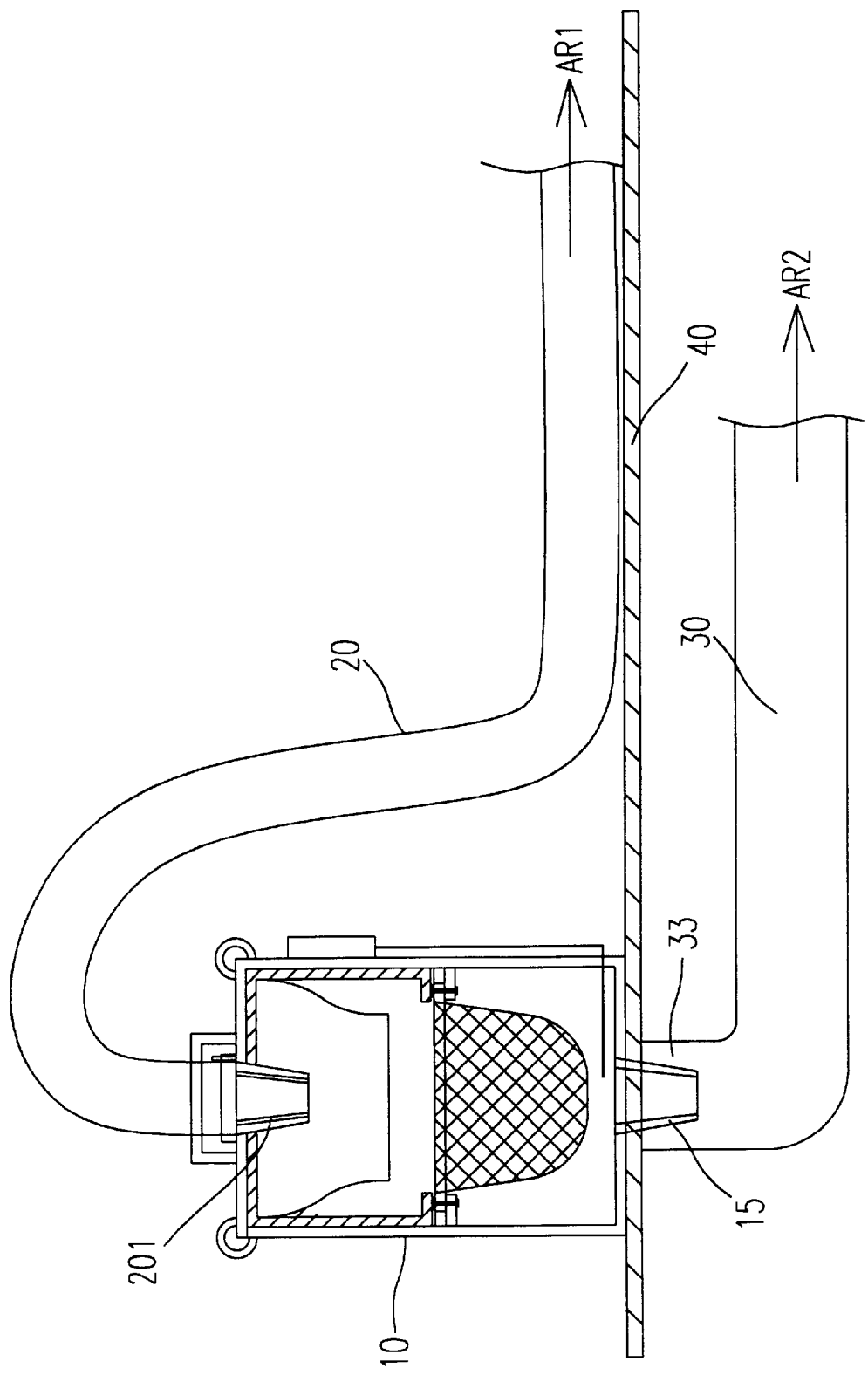
FIG. 6 is a schematic diagram showing the device for collecting by-products to be assembled with the low vacuum system.

Please refer to FIG. 5 and FIG. 6. In order to prevent the factory from a fire, the user needs to use collecting devices 10 to collect by-products individually from machines. A low vacuum system 32 is connected to the first collecting device 10 for forming airflow to carry the first by-product α from the first machine A through the first low vacuum tube 20. The airflow carrying the first by-product α will be filtered by the collecting device 10 to retain the first by-product α in the collecting device 10. The filtered airflow then passes through the powder trap to the second low vacuum tube 30. The collecting device 10 of the present invention includes a body 10, an entrance 11 provided on an upper portion of the body 10 for enabling the airflow to flow into the body 10, a powder trap 13 mounted in the body 10 for filtering the airflow to retain the by-product therein, a guiding device 12 mounted in the body 10 for guiding the airflow to pass the powder trap 13, and an exit 15 provided on a lower portion of the body 10 for enabling the filtered airflow to flow out. As shown in FIG. 6, the first arrow AR1 in the first low vacuum tube 20 refers to one end of the machine, and the second arrow AR2 in the second low vacuum tube 30 refers to the low vacuum system 32.

Please refer to FIG. 5 again. The guiding device 12 of the collecting device 10 is mounted between the entrance 11 and the powder trap 13. The guiding device 12 has a smoothly curved surface with an upper cross section bigger than a lower cross section for guiding the airflow to pass the powder trap 13. The guiding device 12 is used to enable the airflow to pass through the powder trap 13 more smoothly so that the by-products are accumulated in the bottom of the powder trap 13 and the airflow passes through the side surface of the powder trap 13 for increasing the useful life of the powder trap 13.

The powder trap 13 of the present invention can be replaced by a disposable powder trap 13 as a dust catcher which is commonly used in the house and industry so that it is easily changed and is economical. There is a cavity 14 formed between the powder trap 13 and the walls of the body 10 for enabling the airflow to rapidly flow through the bottom and side surfaces of the powder trap 13. The body 10 of the collecting device is made of polypropylene. The body of the collecting device 10 is a cylinder which is 35 cm in height and 25 cm in diameter. The shape and the size of the device 10 can be adjusted according to the real situation.

Please refer to FIG. 6. The entrance 11 of the collecting device 10 is connected to the inlet 201 of the low vacuum tube 20, and the exit 15 is connected to one end of the low vacuum tube 30. The exit 15 is in a circular cone shape with an upper cross section bigger than a lower cross section for being connected to the inlet hole 33 of the second low vacuum 30. Please refer to FIG. 5. There are two handles 16 in the upper end of the device 10 for easily moving the device. The device 10 further includes an openable upper cover 17 which is removed while changing the powder trap 13 and cleaning the body 10 of the device. The openable upper cover 17 has an exit cover 171 and a pin 172 for closely securing the exit cover 171 to the openable upper cover 17 and preventing the by-products from being evaporated. The device 10 has a hooking ring 102 for hooking the openable upper cover 17 and a pressure gauge 18 for measuring a pressure inside the device 10 to determine the time for changing the powder trap 13. The pressure gauge 18 has a probe 181 mounted between the powder trap and the exit 15 for measuring the pressure near the exit 15. The collecting device 10 further includes a holding element 131 for holding the powder trap 13. The holding element 131 includes a screw 132 mounted through a tap hole of the powder trap 13 to secure one end of the powder trap 13. The device includes a pressing element 19, and the holding element 131 further includes a piece of rubber 133 mounted between the pressing element 19 and the screw 132 for securing the powder trap 13.

Please refer to FIG. 6. The user needs to lift the collecting device 10 by holding the handle 16 for connecting the exit 15 of the collecting device to the low vacuum system 10 in use.

Figure 8:
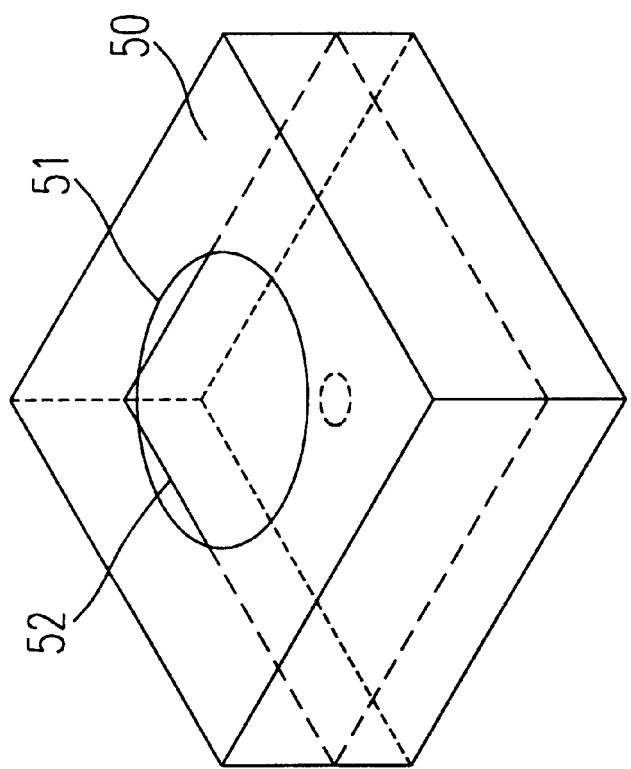
FIG. 8 is a schematic diagram showing a supporting device for the collecting device of the preferred embodiment of the present invention.
Figure 7:
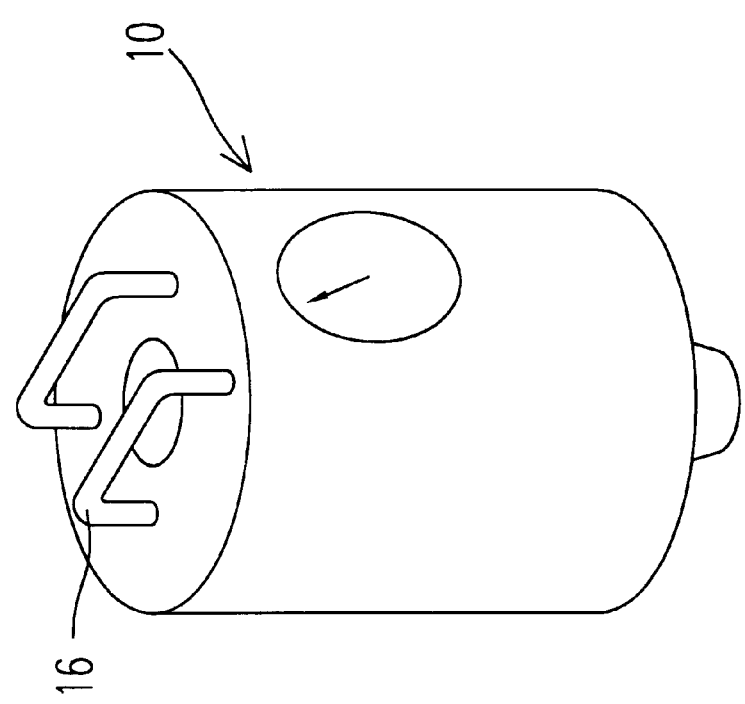
FIG. 7 is a perspective diagram of FIG. 5.

Please refer to FIGS. 5 to 8. As shown in FIG. 8, there is a supporting device 50 for placing the collecting device 10. The supporting device 50 has an opening 51 for placing the collecting device 10 thereon and a base plate 52 for receiving the by-products fallen from the exit 15 of the collecting device 10 to avoid the twice pollution.

Figure 9:
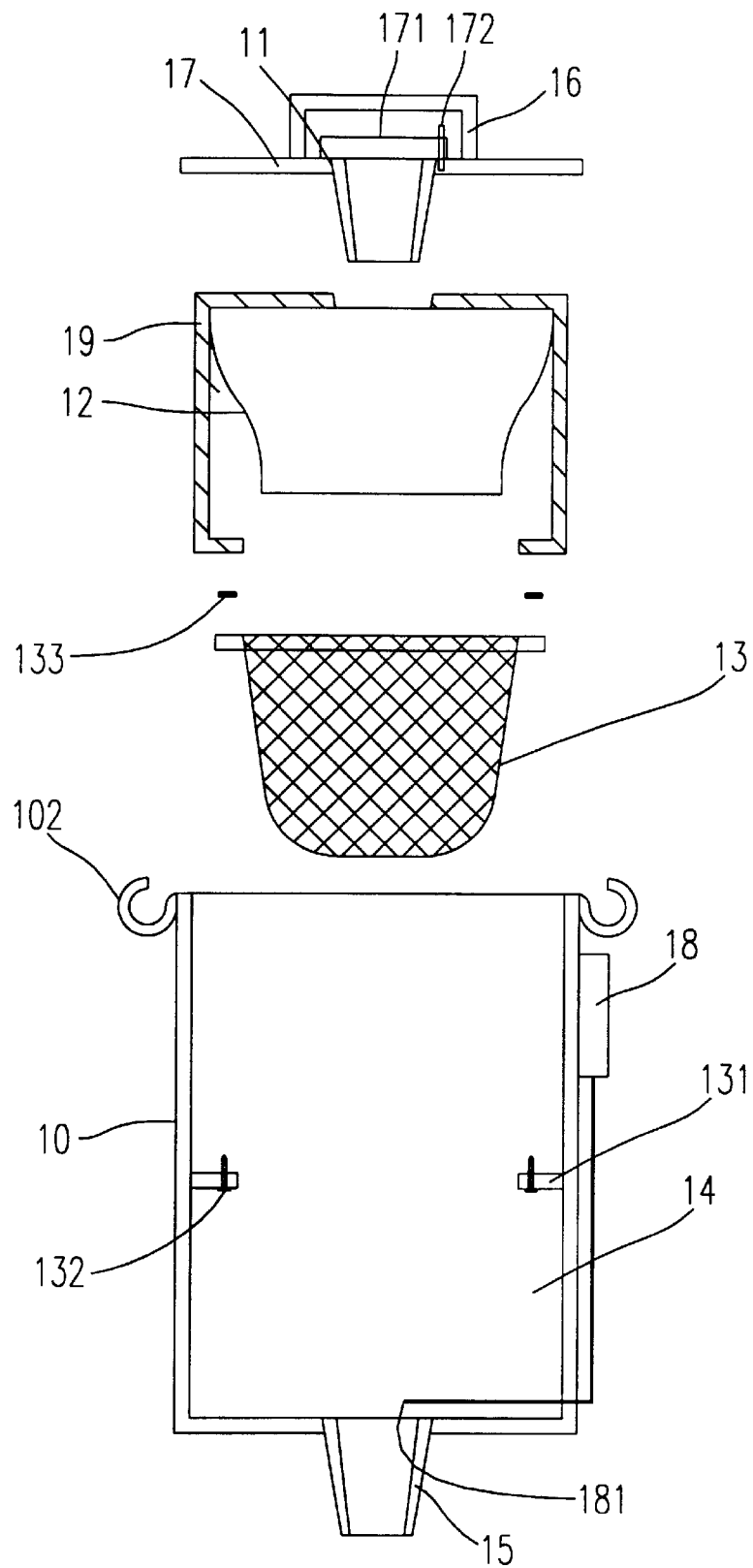
FIG. 9 is a schematic diagram showing the disassembly of the device for collecting by-products of the preferred embodiment of the present invention.

Please refer to FIG. 9. When the user wants to change the powder trap 13, he must disassemble the collecting device 10 by taking the upper cover 17 and guiding device 12 out of the body 10. If a user wants to maintain the collecting device 10, he must disassemble the collecting device 10, the portion of the upper cover 17, the guiding device 12, the powder trap 13, the pressure gauge 18, and the holding element 131.

The present invention has the advantages of preventing the by-products from being reacted with each other resulting in a fire, and preventing the low vacuum tube from being chocked by by-products.

The above embodiments can be modified by any skillful person in the art without departing the spirit and scope of the accompanying claims.

What is claimed is:

1. An apparatus for treating a plurality of by-products respectively generated in a corresponding plurality of sources during a semiconductor manufacturing process, comprising:
    a plurality of filtering devices, each of which provides communication between a respective source with a respective introducing duct for separating and collecting a respective by-product generated in said respective source in response to an airflow which carries said respective by-product from said respective source; and
    a vacuum system providing communication with said plurality of filtering devices and with a common introducing duct simultaneously for generating said airflow to carry said by-products,
    wherein each of said filtering devices includes:
    a body;
    an entrance provided on an upper portion of said body and having a first connection head to be communicated with said respective source generating said respective by-product for enabling said airflow to flow into said body;
    a powder trap mounted in said body for filtering said airflow to retain said respective by-product therein;
    a guiding device mounted between said entrance and said powder trap for guiding said airflow to pass said powder trap; and
    an exit provided on a lower portion of said body and having a second connection head to be communicated with said vacuum system for enabling said airflow to flow out.

2. The apparatus according to claim 1 wherein said powder trap of said filtering device has a curved inner surface with an upper cross section which is larger than a lower cross section.

3. The apparatus according to claim 1 wherein said exit of each of said filtering devices is connected to said vacuum system for forming a suction head to drive said airflow.

4. The apparatus according to claim 1 wherein said filtering device further includes a handle for moving said filtering device.

5. The apparatus according to claim 1 wherein said filtering device further includes a pressure gauge for measuring a pressure inside said filtering device to determine the time for changing said powder trap.

6. The apparatus according to claim 5 wherein said pressure gauge has a probe mounted between said powder trap and said exit for measuring said pressure near said exit.

7. The apparatus according to claim 1 wherein said filtering device further includes a holding element for holding said powder trap.

8. The apparatus according to claim 7 wherein said holding element includes a screw mounted through a tap hole of said powder trap to secure one end of said powder trap.

9. The apparatus according to claim 8 wherein said filtering device further includes a pressing element, and said holding element further includes a piece of rubber mounted between said pressing element and said screw for securing said powder trap.

10. The apparatus according to claim 1 wherein said filtering device further includes an openable upper cover which is removed while changing said powder trap and cleaning said body of said filtering device.

11. The apparatus according to claim 10 wherein said openable upper cover has an exit cover and a pin for closely securing said exit cover to said openable upper cover.

12. The apparatus according to claim 10 wherein said filtering device further includes a hooking ring for hooking said openable upper cover.

13. The apparatus according to claim 1 wherein said body is a cylinder.

14. The apparatus according to claim 13 wherein said cylinder is about 35 cm in height and about 25 cm in diameter.

15. The apparatus according to claim 1 wherein said guiding device has a smoothly curved surface with an upper cross section which is larger than a lower cross section of said guiding device.

16. The apparatus according to claim 1 wherein a cavity is formed between said powder trap and walls of said body for enabling said airflow to flow through bottom and side surfaces of said powder trap.

17. The apparatus according to claim 1, further includes a supporting device having an opening for placing said filtering device thereon.

18. The apparatus according to claim 17 wherein said supporting device has a base plate for receiving said by-product fallen from said exit of said filtering device.

19. A device for filtering an airflow accompanied with a byproduct generated in a source during a semiconductor manufacturing process to retain said by-product therein, comprising:
    a body;
    an entrance provided on an upper portion of said body and having a first connection head to be communicated with said source for enabling said airflow to flow into said body;

a powder trap mounted in said body for filtering said airflow to retain said by-product therein;

a guiding device mounted between said entrance and said powder trap for guiding said airflow to pass into said powder trap; and an exit provided on a lower portion of said body and having a second connection head to be in communication with a vacuum system generating said airflow to carry said by-product for enabling said fluid to flow out.

20. A method for treating a plurality of by-products respectively generated in a corresponding plurality of sources during a semiconductor manufacturing process, comprising steps of:

provideing a corresponding plurality of filtering devices, each of which communicates between a respective source and a respective introducing duct for collecting and separating a respective by-product generated in said respective source from an airflow which carries said respective by-product from said respective source; and providing a vacuum system connected to said plurality of filtering devices simultaneously for generating said airflow to carry said by-products, wherein each of said filtering devices includes:

a body;

an entrance provided on an upper portion of said body and having a first connection head in communication with said respective source generating said respective by-product for enabling said airflow to flow into said body;

a powder trap mounted in said body for filtering said airflow to retain said respective by-product therein;

a guiding device mounted between said entrance and said powder trap for guiding said airflow to pass said powder trap; and an exit provided on a lower portion of said body and having a second connection head in communication with said vacuum system for enabling said airflow to flow out.

* * * * *